United States Patent [19]

Kovach et al.

[11] Patent Number: 5,043,931
[45] Date of Patent: Aug. 27, 1991

[54] WRAP TEST SYSTEM AND METHOD

[75] Inventors: Robert C. Kovach, Aurora, Ohio; Bradley S. McDonald, Leander, Tex..

[73] Assignee: International Business Machines Corporation, Armonk, N.Y.

[21] Appl. No.: 368,438

[22] Filed: Jun. 19, 1989

[51] Int. Cl.$^5$ .................. G05B 23/02; H03M 1/10
[52] U.S. Cl. .................. 364/579; 200/51.1; 200/2; 341/120; 370/15; 371/20.5; 379/5; 364/481
[58] Field of Search ............. 324/73.1, 158 P; 341/110, 120; 370/15, 16; 371/20.5, 21.2; 200/51.10, 51.11, 2, 1 V; 379/5, 6; 364/481, 579, 152, 153, 159; 439/43

[56] References Cited

U.S. PATENT DOCUMENTS

| | | | |
|---|---|---|---|
| 3,692,966 | 9/1972 | Lancaster | 200/51.1 |
| 3,816,813 | 6/1974 | Jehu | 324/73 R |
| 4,256,936 | 3/1981 | Lancaster | 200/51.07 |
| 4,266,292 | 5/1981 | Regan | 370/13 |
| 4,335,373 | 6/1982 | Sloane | 340/347 CC |
| 4,419,656 | 12/1983 | Sloane | 340/347 CC |
| 4,514,806 | 4/1985 | Hartig | 364/200 |
| 4,583,075 | 4/1986 | Sloane | 340/347 CC |
| 4,593,270 | 6/1986 | White | 340/347 AD |
| 4,677,581 | 6/1987 | Malka | 364/571 |
| 4,688,234 | 8/1987 | Robinton | 375/10 |
| 4,758,781 | 7/1988 | Ueno et al. | 324/73.1 |
| 4,772,948 | 9/1988 | Irvin | 358/139 |
| 4,780,755 | 10/1988 | Knierim | 358/10 |

Primary Examiner—Kevin J. Teska
Assistant Examiner—Thomas S. Auchterlonie
Attorney, Agent, or Firm—R. M. Carwell

[57] ABSTRACT

A system and method automatically providing wrap interconnections for wrap diagnostic capability of analog-digital conversion systems obviating the need for wrap cables. A connector system has a first state wherein DAC outputs are automatically internally routed to corresponding ADC inputs thereby closing a wrap loop whereupon automated DAC to ADC loop tests are performed. A second switching state is provided automatically by insertion of connector plugs into the connector system whereby the loop is broken and DAC outputs and ADC inputs are made available externally to respective output and input connectors. In one embodiment the switching system has application to an audio digitizing capture and playback adapter card. In the first state the card is automatically configured for a wrap diagnostic test. In the second state effected by insertion of plugs into the input and output jacks of the switching system, the test loop is broken and the card is automatically thereby configured for normal operation wherein analog audio source material is delivered to the ADCs through the input connector and/or output of audio data re-converted from digital to analog form is provided to the output connector from the DACs.

3 Claims, 4 Drawing Sheets

WRAP TEST SYSTEM AND METHOD

DESCRIPTION

1. Technical Field

This invention relates to systems and methods for testing electronic equipment and, more particularly, relates to such systems and methods providing for wrap diagnostic capabilities.

2. Background Art

In the operation of electronics equipment it is important that such equipment having external connections should be provided with systems and methods for diagnosing proper operation of the device. Essentially two main approaches have been followed in the art for effecting this desired goal.

The first approach requires the equipment operator to be involved in the testing process resulting in numerous problems. First, external equipment is typically required to evaluate the performance of the device under test. For example, at a minimum an audio digitizing or capture and playback adapter card for use with personal computers might require an amplifier, headphones or speakers, and some analog audio source input device such as a microphone, pre-amplifiers, and the like for assessing whether the adapter card is operating properly.

With the necessity for such equipment, it makes the task all the more difficult for an operator to determine which device is failing, i.e., whether it is the device under test or one or more of the pieces of peripheral equipment necessary to perform the tests. As more peripheral equipment and interconnections are required the aforementioned reliability problems associated with testing are compounded further. In the preceding example with respect to an audio capture card, if poor quality or no sound is produced, it is not readily ascertainable whether the headphones or speaker are at fault, the cabling, the output amplifier, input device, or the capture card itself are defective.

Yet an additional problem associated with the first testing approach requiring such user interaction in the test procedure relates to the testing personnel often being required to evaluate subjective quality. In the aforementioned environment, as but one example, this might require the test operator to assess whether the audio sounded "good". Such subjective determinations will depend highly on the type and quality of the test equipment being used, and the sound quality of the source material. Accordingly, employing this type of testing is therefore often an unreliable method for determining whether a digitizing card is defective for example.

Due to the foregoing deficiencies of user involvement in testing procedures, the second major approach to the testing problem was developed in the art as previously noted. In this method, a wrap test well known in the art is performed. Typically in this form of testing a wrap back cable is provided allowing the device under test to essentially diagnose itself, thus the adapter card would be configured to essentially test itself via a wrap connection for example. This is obviously a very desirable alternative if the particular hardware of the device under test is capable of performing such tests, i.e., if the output of the device is compatible with the required input. Such is the case in the example being given of an audio capture and playback card as is also true for many other types of equipment.

In the case of such an adapter card, typically an analog-to-digital converter is provided on board for converting raw analog audio source material into digital form whereupon it is subsequently processed. The adapter card is further conventionally provided with a digital-to-analog (DAC) converter whereby the digitized signal, after digital processing, filtering, editing or the like are completed, is re-converted back to analog form by an analog-to-digital converter (ADC) for subsequent output to a speaker for example. Employing the wrap connection type of testing, test patterns are input into the DAC whose output is then routed back to the ADC for measurement of the signals and comparison to the known input test signals, thereby effecting a method for verifying the system's proper operation.

However, a serious problem is associated in the art with providing for such highly desirable wrap testing, often resulting in failure of equipment manufacturers to even provide for such testing, namely that wrap cables are required. These cables essentially are cables having connectors on one end compatible with the output connectors of the device and additional connectors on the opposing end of the cable compatible with the input requirements of the input connectors of the device under test. In operation the cable is simply interconnected to the input and output connectors of the device under test to form a feedback loop.

Not only do such wrap cables increase the cost of the product but they must at all times remain highly reliable inasmuch as they form a crucial link in the feedback loop in this form of testing. Unfortunately such cables, as is often the case with respect to cables and associated connectors in general, are often notoriously unreliable.

Moreover, when an equipment manufacturer relies upon this form of testing, a successful test indicator is often in the form of an absolute "go" or "no go" indicator. Information necessary for redundantly performing backup testing by the operator is therefore not always provided by the manufacturer. Accordingly, when wrap cables are misplaced or damaged, as is often the case, the highly undesirable situation is created wherein there is effectively no practical way to test the device.

Connectors have long been known in the art configured whereby one form of electrical interconnection is provided with the connector in one state and yet a second form of operation is provided for when the connector is in a second state. The most obvious example of this might perhaps be the situation of a typical headphone jack of a stereo tuner or amplifier. With the headphone plug disconnected from the jack, speakers are enabled whereas upon insertion of the headphone plug into the jack the speakers are disabled and the headphones are operable. However, these types of dual-purpose connections are typically, as in the example given, only provided for changing the normal modes of operation of the equipment for which it is intended (headphone/speaker play) and not in situations requiring a transitory test mode of operation, as in the aforementioned case of infrequent self-diagnostic tests.

Moreover, such dual purpose interconnections provided by switch connections known in the art are also most typically found in equipment which is not conducive to self-testing in that the inputs and outputs are non-compatible. In the prior illustration it would simply be nonsensical to provide a headphone jack wherein audio output thereto was fed back into the input of the amplifier when the headphone plug is disconnected.

For all the foregoing reasons, an improved solution for providing self-diagnostic wrap testing of equipment was highly desired which was both reliable, cost effective, and which did not require additional manufacturing operations or components. These and other benefits of the wrap diagnostic system and method of the invention are provided.

SUMMARY OF THE INVENTION

A system and method is provided for automatically providing wrap interconnections for wrap diagnostic capability of analog-digital conversion systems obviating the need for wrap cables. A connection system is provided whereby in a first state (with input and output connectors disconnected from a switch mechanism) DAC outputs of one or more channels are automatically routed to corresponding inputs of one or more respective ADC units thereby closing a loop, whereupon automated DAC-to-ADC loop tests may be performed to assess operation of the DACs and ADCs. The switching mechanism is further configured whereby with input and output connectors interconnected to the switching mechanism a second switching state is provided automatically by introduction of the connectors into the mechanism. In this state the feedback loop is broken whereupon on DAC outputs and ADC inputs are directly connected to respective ones of these output and input connectors. In one embodiment the switching system has application to an audio digitizing capture and playback adapter card wherein in the first state the card is automatically configured for a wrap diagnostic test. Upon insertion of a connector to the input or output jacks of the switching system the test loop is broken and reconfiguration for intended normal operation of the card is automatically effected with input of analog audio source material being delivered to the ADCs through the input connector and/or output of analog audio data being delivered to the output connector from the DACs.

BRIEF DESCRIPTION OF THE DRAWINGS

The novel features believed to be characteristic of the invention are set forth in the appended claims. The invention itself, however, as well as other features and advantages thereof, will be best understood by reference to the following description of the preferred embodiment, when read in conjunction with the accompanying figures, wherein:

DETAILED DESCRIPTION OF THE PREFERRED EMBODIMENT

Figure 1:
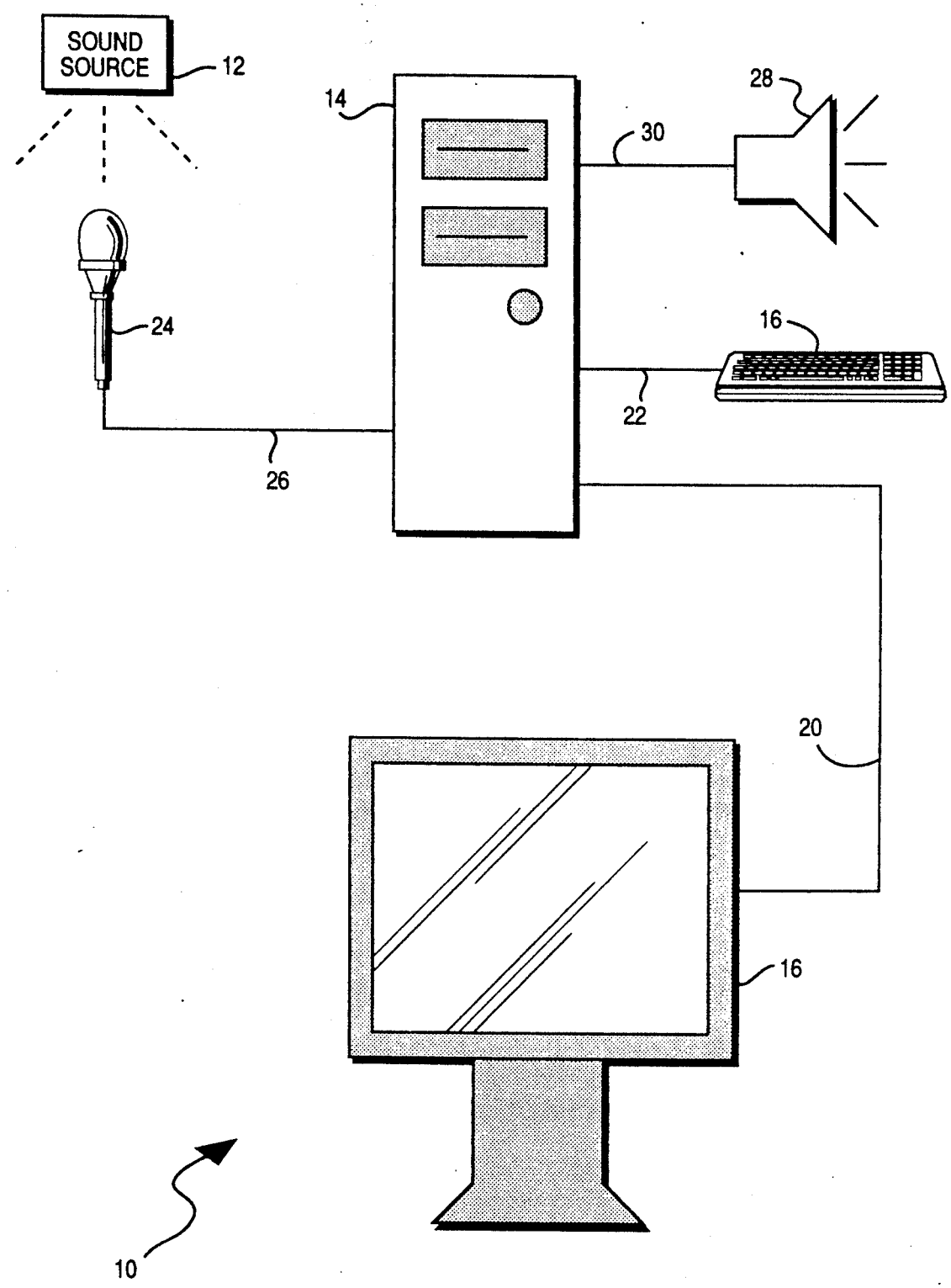
FIG. 1 is a block diagram of a data processing system configured as a capture, editing, and playback system for audio data adapted to employ the wrap diagnostic system and method of the present invention.

With reference first to FIG. 1, a high level description will be provided of a digital audio capture, editing and playback system 10 illustrated therein which is a particularly suitable environment for the wrap back diagnostic systems and methods of the present invention. The system 10 will typically include a digital computer 14, preferably in the form of a personal computer, a keyboard 16 for providing user input on line 22 to the computer 14, and a monitor 16 for providing visual displays to the user including prompts as a result of signals carried on line 20 from the computer 14 to the monitor 16, these prompts of course being used in a conventional manner for requesting the aforementioned user input on keyboard 16. Included in the computer 14 will be some type of audio processor either on the mother board of the computer or alternatively in the form of an adapter cards insertable into a peripheral expansion slot within the computer 14 which communicates to the CPU of the computer 14 through the computer's bus structure. A representative example of such adapter cards is the Ariel DSP-16 data acquisition processor available from Pacific Microcircuits Limited, Blane, Wash.

The audio processor performs numerous functions but essentially converts analog audio input data provided to the computer 14 through an input jack to digital form (whereupon it is edited and processed in digital form by the computer 14), and then the processor reconverts this digitized data back to analog form whereupon it is output from an output jack on line 30 (or cord 40, FIG. 2) to an external signal receptor such as speaker 28 or the like, or some other peripheral output device. Conventionally, the adapter card itself may thus carry the analog audio source input and output jacks interconnected, respectively, to an ADC and DAC also on board on the adapter card. It will be apparent that the signal levels on these input and output jacks are a matter of choice and may be line and/or mic levels as desired.

In some cases wherein stereo capability is provided, it will be readily apparent that a duplicate set of input and output jacks and DAC-ADC paths will be provided to implement the second channel. Although the connector system of the invention described herein has been depicted with respect to such a stereo adapter card, it will be readily apparent to those skilled in the art that the teachings of the invention are far broader and embrace three or more channels or monophonic applications employing only one analog input-output connector pair and one ADC-DAC path therebetween. Moreover, the invention further contemplates use not only with audio digitizer data but virtually any wrap back self-diagnostic technique and equipment requiring same wherein it is desirable for the equipment to be in an internal wrap back test mode until a plug is inserted into the equipment thereby breaking the feedback loop and providing externally interconnection to one or more of the components in the loop during the execution of the wrap back testing.

Still referring to FIG. 1, it will be apparent that in the embodiment of the system 10 depicted therein an external signal source such as a microphone 24 is included for converting analog sound from a convenient sound source 12 into a conventional electrical form for delivery on line 26 (or cord 40, FIG. 2) to the audio processor within the computer 14. Thus, it will further be apparent that this analog input signal line 26 would be interconnected to the analog input connector on the adapter card when it is desired to input analog audio source information for digitizing. However other analog audio data may be provided on line 26 from an alternative source such as a tape recorder or the like. Similarly, the line 30 will obviously be intended to be interconnected to the analog audio output jack of the adapter card or computer 14 during normal operation wherein it is desired to hear or view the reconverted analog audio data during normal operation of the system 10. As will hereinafter be described, upon insertion of either a plug from the analog source input or analog audio output to their appropriate jacks, the internal wrap back loop will be broken whereas the system 10 will automatically always be configured for continuous wrap back diagnostic testing as frequently as desired upon removal of the input and output plugs associated with lines 26 and 30 from respective jacks on the audio processor.

It will be noted that the invention is not intended to be limited to an adapter card application (although a convenient form) and admits to, for example, applications in which the functions of the adapter card are performed onboard on the mother board of computer 14 which, in like manner to the adapter card, would carry audio input and output jacks.

It will be appreciated that when the system 10 is configured in the automatic wrap back test mode by reason of removal of jacks associated with lines 26 and 30, because the system 10 is computer controlled, it readily lends itself to automated testing of the audio processor and reporting of the test results on the monitor screen 16 or other suitable output device. In a preferred embodiment of the invention, the system 10 may include a personal computer such as an IBM Model 70 Personal Computer manufactured by the International Business Machines Corporation, Armonk, N.Y.

Figure 2:
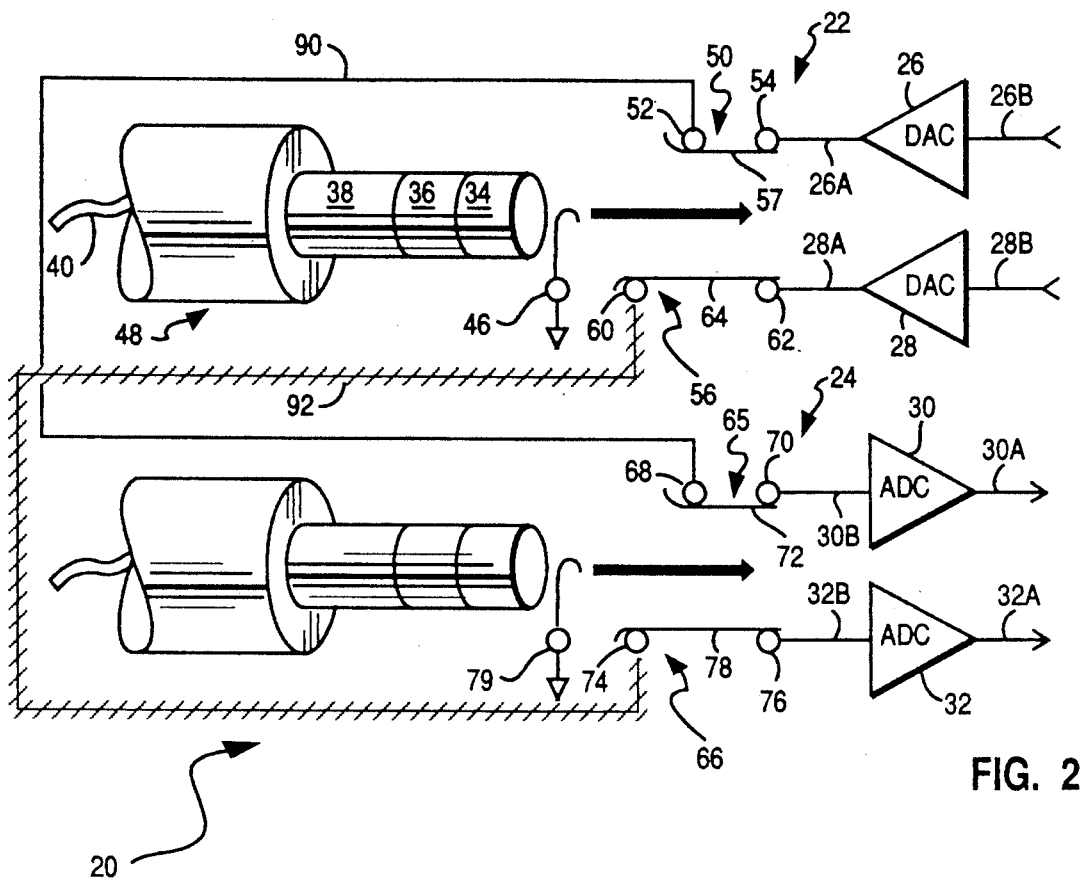
FIG. 2 is a simplified schematic block diagram of a portion of an audio capture and playback adapter card adapted for use in the host personal computer of the system of FIG. 1, such card employing the wrap back diagnostic connector system of the invention and shown in the wrap test configuration.

Referring now to FIG. 2, depicted therein is a connector system 20 of the invention for use with the audio processing system of FIG. 10. The system includes switch connector means including first and second switches 22 and 24. In the embodiment depicted the first and second switches may each take the form of a five pin connector which is a stereo minijack suitable for printed circuit board mounting such Part No. 1834 manufactured by the Sakat Company or Part No. 1899 manufactured by the Shogyo Company. These switching connector are designed to receive a stereo miniplug 48 having a three part conductive tip wherein each part is electrically isolated from the remaining parts but electrically interconnected to a respective conductor forming a cable 40 exiting the plug 48. The three part tip is comprised of a first ring tip 34, a second ring tip 36, and a third ring tip 38.

The first switch 22 is comprised of first and second contact pairs 50 and 56, respectively. The first contact pair 50 is in turn comprised of first contact 52 and second contact 54 and a switch member 57. The second contact pair 56 is comprised of a first contact 60, a second contact 62 and a switch member 64.

The second switch 24 is of a like construction and is thus comprised of first and second contact pairs 65 and 66, respectively. The first contact pair 65 in turn is comprised of a first and second contact 68 and 70, respectively, and a switch member 72. The second contact pair 66 of the second switch 24 is in like manner comprised of a first and second contact 74 and 76 and a switch member 78. As aforementioned the switches 22 and 24 are preferably DPST switches wherein the switch members 57, 64, 72, and 78 are normally in the electrical configuration shown with reference to FIG. 2 when a corresponding plug such as plug 48 is not plugged into its respective switch. More particularly, with the plugs 48 disconnected from the switches 22 and 24, switch member 57 will form a closed circuit between its respective first and second contacts 52 and 54; switch member 64 will form a closed circuit between its respective first and second contacts 60 and 62; switch member 72 will form a closed circuit between its respective first and second contacts 68 and 70; and switch member 78 will form a closed circuit between its first and second contacts 74 and 76.

Figure 3:
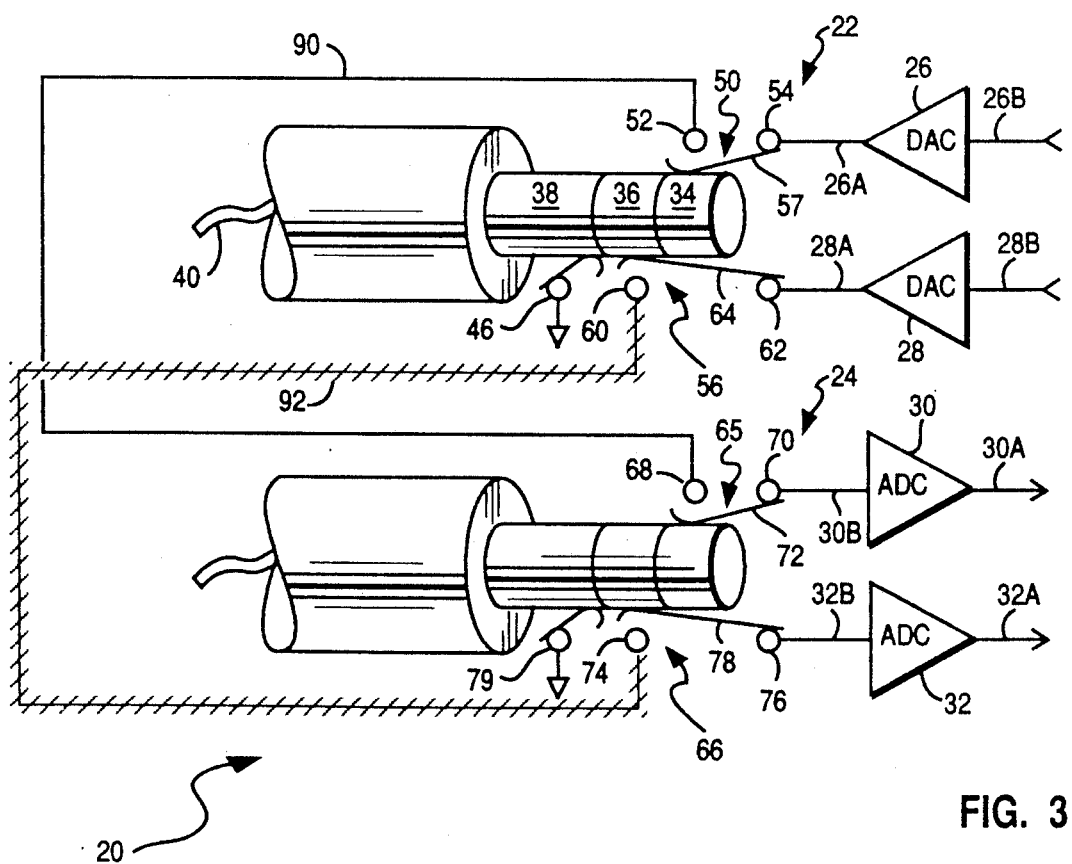
FIG. 3 is another view of FIG. 2 with the audio connectors to the system engaging the connector system of the invention so as to configure it in a normal non-wrap back operational mode.

Conversely, with an appropriate plug 48 properly disposed in the first switch 22, the mechanical action thereof is such that the electrical connection formed by the contacts of the first and second contact pairs 50 and 56 are thereby broken in the manner shown. Moreover, as a result of such mechanical interconnection, as shown in FIG. 3 the first ring tip 34 is electrically connected through the switch member 57 to the contact 54 of first contact pair 50 and the switch member 64 of the second contact pair 56 forms an electrical interconnection between the second ring tip 36 and the second contact 62.

It will be noted that in the embodiment depicted herein a pair of digital-to-analog converters 26 and 28 are provided having respective outputs 26A and 28A interconnected to second contact 54 and 62, respectively. Inputs 26B and 28B are provided on the adapter card or other audio processor to respective ones of the DACs 26 and 28 from other circuitry such as a digital signal processor or DSP. With a plug 48 disposed in the first switch 22 as shown in FIG. 3, it will thus be appreciated that two electrical paths are thereby formed. The first path is from DAC input 26B through DAC 26, through line 26, through contact 54, through switch member 57, through first ring tip 34, and through its respective conductor forming a portion of the cable 40.

In like manner, the second path is formed through DAC input 28B, through DAC 28, through DAC output 28A, through second contact 62, through switch member 64, through second ring tip 36, and through its respective conductor also forming a portion of cable 40 interconnected to the plug 48. Also on the tip of plug 48 it will be noted that when it is plugged into the first switch 22, the third ring tip 38 connected to a ground wire in cable 40 is brought into electrical interconnection with the ground terminal 46 of the first switch 22. In this manner with one of the plugs 48 thus disposed in the switch 22 to form the aforementioned paths, it will be appreciated that digital audio on the input line 26B after conversion to analog form by DAC 26 will be in analog form on line 26A and will be routed through the first switch 22 to its respective conductor in the cable 40 and that, for example, interconnection of a speaker between this conductor and the conductor contacting the ground terminal 46 will result in sound associated with the digital audio on channel 26B being perceived through the speaker.

In like manner, analog audio information corresponding to digital audio on channel 28B will pass through the aforementioned second path whereby when a speaker is interconnected between the ground of cable 40 and the other conductor of cable 40 interconnected to the second ring tip 36, analog audio information of the other channel may be perceived through this second speaker.

Operation of the second switch 24 is similar to that hereinbefore described with reference to the first switch 22, namely that with a plug 48 disposed outwards of the second switch 24 the electrical paths through the second switch 24 will be as shown in FIG. 2 whereas with second plug 48 disposed properly in the second switch 24, similar first and second paths will be created through the second switch 24. The first such path is from a conductor of the cable 40 through first ring tip 34, through switch member 72, through second contact 70, through line 30B, through ADC 30, and through ADC output line 30A. A second path is formed by a conductor of cable 40 through second ring tip 36, through switch member 78, through contact 76, through line 32B, which is an input to ADC 32, through ADC 32 and thence to ADC output 32A. As with the first switch 22, a ground terminal 79 is provided in the second switch 24 for interconnection of third ring tip 38 to the ground conductor in cable 40 when plug 48 is inserted into the switch 24. In like manner to the DACs 26-28, in a preferred embodiment the audio adapter board will also carry these ADCs 30 and 32, the respective outputs 30A and 32A being routed to other circuitry on the board for subsequent processing by the system 10.

Comparison of the electrical pathways formed by presence of plugs 48 in their respective first and second switches 22 and 24 and removal of both plugs from such switches will reveal an important feature of the thus described switch arrangement facilitating the automatic transition between an internal wrap test configuration first mode and a second mode of the connector system 20 wherein the DACs 26 and 28 and ADC 30 and 32 may interact with external analog audio signal receptors and signal sources as intended during normal operation of the system 10. More particularly, with reference to the first mode as depicted in FIG. 2, it will be noted that with absence of both plugs 48 from their respective switches 22 and 24, a completed circuit path is formed from DAC input 26B, through first switch 22, through second switch 24, through ADC 30 to ADC output 30A. In like manner, the second channel DAC input 28B is routed through DAC 28 and through first and second switches 22 and 24 through ADC input 32B to ADC output 32A. It is important to note that these two pathways in the first or wrap test configuration are effected by means of the arrangement of the connector system 20 itself and more particularly the wiring between the first and second switches 22 and 24 and is not effected by means of any external cabling between these first and second switches as was conventionally done in the prior art. Thus, without any plugs 48 plugged into their respective switches 22 and 24, which is normally done during normal operation of the audio processor for the purposes intended, the processor is thus automatically configured continuously in a wrap around test configuration mode with the inputs 26B and 28B after conversion to analog formed by DACs 26 and 28 being automatically routed as outputs 26A and 28A to respective ADCs 30 and 32. In this configuration it will be readily apparent that by insertion of known digital test signals into these DAC inputs 26B and 28B by the system 10, after conversion to analog form by DACs 26 and 28 and subsequent reconversion to digital form by ADC 30 and 32, the system 10 may be designed whereby comparisons may be made by these input signals on DAC inputs 26B and 28B to correlative digital outputs on ADC outputs 30A and 32A thereby testing the integrity and operation of the DACs, ADCs, switches, and the like, as well as for determining characteristics of the input signals 26B and 28B and forming conclusions as to the equipment generating such input signals.

Comparison of FIG. 3 to FIG. 2 will further reveal that upon insertion of the plugs 48 into their respective switches 22 and 24, this feedback loop routing DAC input signals 26B and 28B to correlative ADCs 30 and 32 is broken thereby taking the DACs, ADCs, and the circuitry interconnected to these DAC inputs and ADC outputs out of the test loop. However, more importantly, not only is the test loop automatically formed and broken, respectively, by removal and insertion of the plugs 48 in their respective first and second switches 22 and 24, putting equipment under test into and out of the first wrap around test mode, but when the plugs 48 are inserted, the connector system 20 automatically in enters the second operational mode for which the external equipment attached to the connector system 20 was intended.

More particularly, as shown in FIG. 3, with the plug 48 inserted properly in the first switch 22 parallel stereo channels are formed by DACs 26 and 28 through the switch 22 to respective output conductors on the cable 40 whereby any digitized audio information on the input channels 26B and 28B may be played back by connection of suitable output devices such as speakers or earphones to the appropriate respective channel's conductors and ground conductor in the cable 40. In like manner, in this second or operational mode as shown in FIG. 3, by means of insertion of a plug 48 into second switch jack 24 the ADCs 30 and 32 are thereby activated by the second switch 24 to receive external analog audio external source information on respective conductors of the cable 40 through their respective contact pairs whereby two channels of audio input source material may be directed on ADC inputs 30B and 32B to their respective ADCs 30 and 32 for subsequent conversion to digital form available on respective outputs 30A and 32A, as is normally intended by the equipment.

Whereas in the embodiment shown a two channel connector system 20 has been described, the invention is not intended to be so limited and it should be apparent that the invention may be readily adapted to single channel systems as well as multiple channel systems having channel numbers exceeding the two shown in the embodiment of FIGS. 2-3. As but one example, as shown by the cross-hatching marks on the connecting lines in FIGS. 2 and 3, only one channel may be formed wherein the first contact pairs 50 and 65 of their respective first and second switches 22 and 24 are not necessary. Thus the invention is intended for use with any number of channels wherein it is desired that a test wrap back configuration be automatically formed in a first mode with plugs 48 removed from corresponding switches whereby output of any given equipment may be routed to the input of other equipment; and a second mode automatically formed by insertion of plugs 48 into their appropriate switches thereby breaking the feedback loop but more importantly providing useful external connections to the equipment providing input to the connector system 20 as well as useful external connections to provide outputs to other equipment interconnected to the connector system 20, (such breaking of the loop and automatic external connections being effected of course by insertion of the plugs 48 for the intended purposes in providing external interfaces to the input and output equipment).

For sake of clarity and completeness it will be noted that in the embodiment shown with references to FIGS. 2 and 3, an electrical interconnection 90 will be made between first contacts 52 and 68 of the first contact pairs 50 and 65 of the first and second switches and, similarly, an electrical connection 92 will be made between the first contacts 60 and 74 of the second contact pairs 56 and 66 of the first and second switches. These connections 90, 92 are internal to the switching system and provide the automatic feedback of signals when in the first or wrap back mode.

Figure 4:
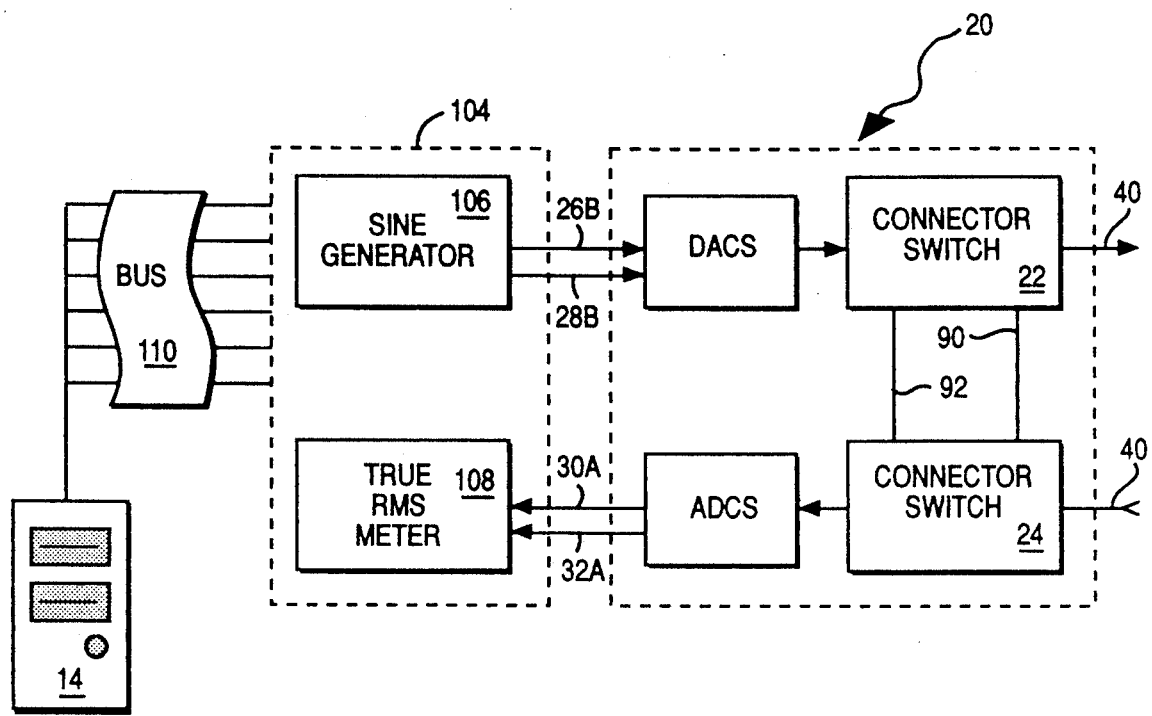
FIG. 4 is a block diagram depicting the wrap back diagnostic test loop formed by the connector system of the invention showing the functional electronic blocks of the loop.

Referring now to FIG. 4, the connector system 20 is shown employed therein for use in an automated test procedure. In FIG. 4 the connector system 20 will be recognized with the inputs 26B, 28B to the DACs and outputs 30A, 32A of the ADCs being shown as connected to a digital signal processor 104 which may preferably reside on board on the adapter card or other audio processor circuitry. Such DSP may take the form of a TMS320C25 DSP Chip manufactured by the Texas Instruments Corporation. The DSP 104 may typically be configured so as to include a sine wave generator 106 and a true RMS meter 108 interconnected respectively to DACs and ADCs. The system of FIG. 4 will further be seen to include the host digital processor 14 of the system 10 of FIG. 1, with the DSP 104 interconnected thereto by means of a conventional computer bus 110. Remaining portions of the test system have been omitted for clarity.

Figure 5:
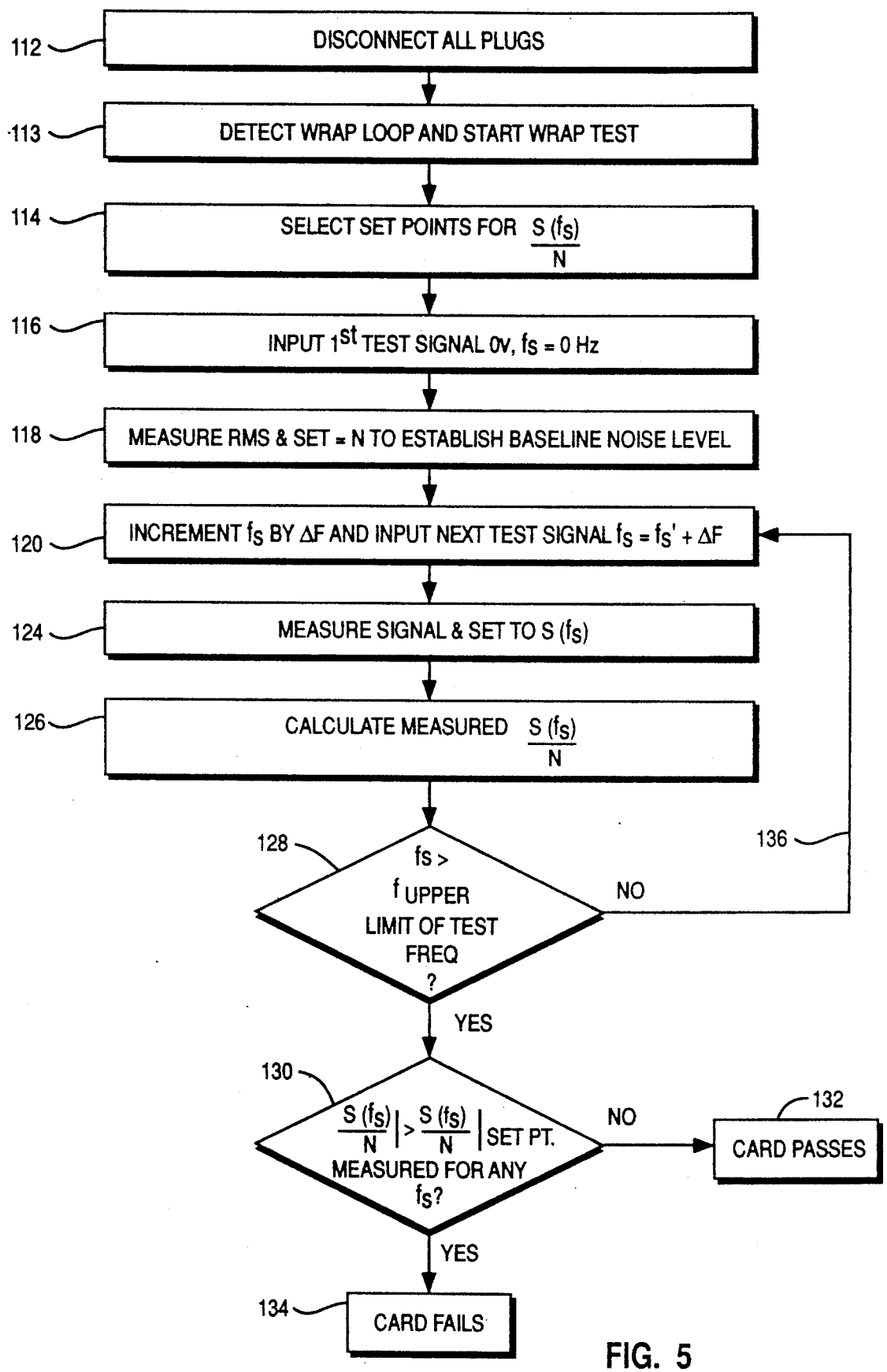
FIG. 5 is a representative software flow diagram for an executive routine executed by the computer 14 of FIG. 1 when the switch connection is in a wrap back test configuration mode for automated testing of an audio processor.

With reference to FIG. 5, the flow diagram of an illustrative executive routine starting at block 113 employed with the system of FIG. 4 is shown. When executed by the host processor 14, the processor in combination with the switch connector means of the invention (when configured in the first mode to effect the desired wrap back test loop) will automatically test the apparatus forming a loop for desired characteristics such as, in this case, testing the DACs and ADCs for acceptable signal-to-noise performance over frequency.

As shown at block 112, first all plug means are disconnected from the switch connector means so as to automatically place the system in a wrap back test loop first mode. This is detected at block 113 by computer 14 which through bus 110 may periodically interrogate status of switch means 20 for presence of wrap test mode 1 whereupon the automated test routine may be started by computer 14. Next as indicated at block 114, set points are selected for acceptable signal to noise ratios $s(f_s)/n$ at each frequency to be tested whereby if the actual measured s/n exceeds this corresponding set point at a given test frequency, the DACs, ADCs and the board or circuitry carrying them are rejected as being unacceptable.

Once these set points have been defined at 114, a first test signal is introduced, block 116, to the DACs at 26B, 28B which is actually a null signal of 0 volts at $f_2 = 0$ Hz.

Next, as indicated at block 118, a measurement is taken by the RMS meter 108 of the DSP 104 at 30A, 32A to establish a baseline noise level with 0 input through the test loop which set equal to n. As shown at block 120, the test frequency $f_s$ generated by the sine generator 106 is next incremented by a constant delta f and a next test signal at a constant nominal test voltage is introduced to the DACs on lines 26B, 28B at this increased frequency $f_s = f_s' + $ delta f, where $f_s' = $ the prior test frequency, and wherein the delta f is nominally 2 KHz as an example.

Still referring to FIG. 5, with the test signal being introduced at this $f_s$ frequency, once again the RMS meter 108 is employed to measure at block 124 RMS signal at ADC outputs 30A, 32A with this measurement being set to $s(f_s)$. Next, at block 126, the measured signal to noise ratio of the system at that particular frequency, $s(f_s)/n$, is calculated, followed by a test at block 128 of whether the current test frequency exceeds the upper limit of the desired test frequency which is nominally 20 KHz. If not, the testing process under software control loops back as shown by arrow 136 to block 120 to increment the test frequency again by delta f and take a next signal measurement and calculation of the signal-to-noise ratio of the system at this next frequency is made.

When testing for signal-to-noise ratios through the frequency spectrum of interest has been completed as indicated by exiting block 128 to block 130, each measured signal-to-noise ratio at a given test frequency is compared to the signal-to-noise ratio set point for that same frequency as specified at block 114. If any such signal-to-noise ratio at a given one of the test frequencies is less than that of the set point for any $f_s$, as indicated at block 134 the system under test is considered to be a failed system such as a failed adapter card. If on the other hand no such measured signal-to-noise ratio exceeds the corresponding set point signal-to-noise ratio at its corresponding test frequency, a system or card passes as indicated by block 132. It will be appreciated from the foregoing that the automated test procedure has thus effectively mapped the transfer function of the wrap back test loop and associated system. Once the desired test has been completed and plugs 48 inserted the system automatically reverts back from the test mode to operation for its intended function of interfacing to external signals.

Figure 6:
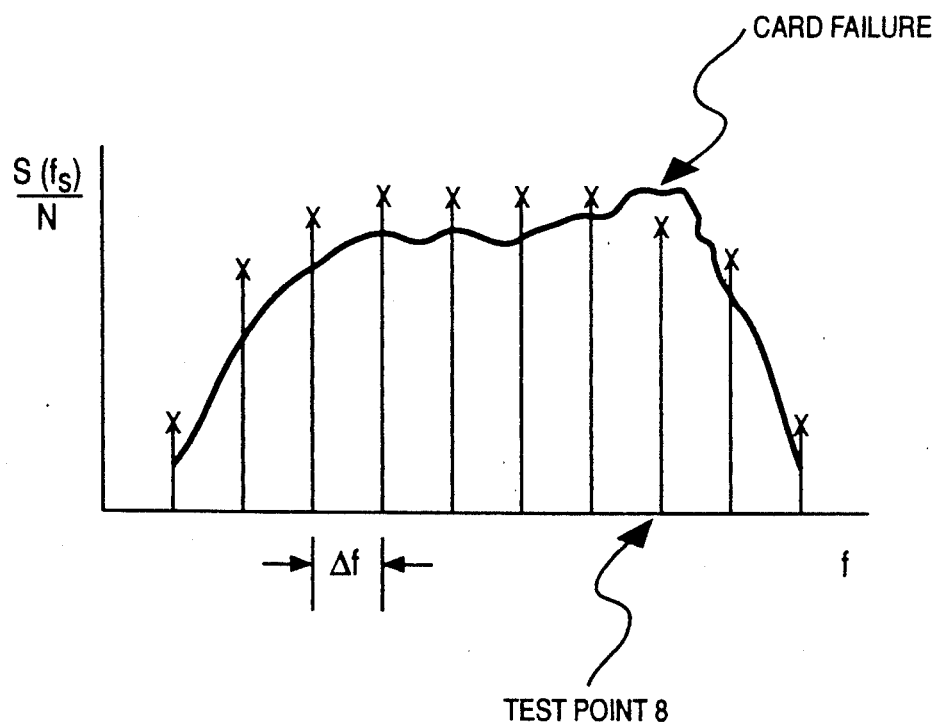
FIG. 6 is a graphical representation of a typical test result of a wrap back diagnostic test routine resulting from execution of the executive program of FIG. 5.

Referring finally to FIG. 6, a typical graph of a transfer function developed by the previously described system is shown wherein at test point 8 the measured signal-to-noise ratio exceeds that of the set point or acceptable signal-to-noise ratio at that frequency, indicating an unacceptable system under test. As previously noted, once the plug means is inserted into switching connector 22, the wrap test loop is broken and the circuit or board under test may resume operation for its intended purpose where, for example, digitized sound data may be converted by DACs to analog form and output externally on connector 22 through line 40 to a speaker. In like manner, by insertion of a plug means into the connector 24, the normal function of the ADC may be resumed with the wrap test loop again broken, whereupon external incoming analog audio data on line 40 will pass through connector 24 to be digitized by the ADCs.

Because of interconnection of connector system 20 to computer 14 through bus 110, the computer may sense the states of switches 22 and 24, and determine if the mode 1 wrap back loop is formed (i.e., plugs 48 are disconnected or alternatively if it is broken (i.e., one or more plugs 48 are inserted into switching jacks 22 or 24.

Therefore, under program control, a system employing the connector system 20 of the invention may provide, upon such sensing or interrogation of the connector states, for automatic continuous or periodic performance of various wrap back tests as desired when in the first wrap back test mode.

While the invention has been shown and described with reference to particular embodiments thereof, it will be understood by those skilled in the art that the foregoing and other changes in form and details may be made therein without departing from the spirit and scope of the invention.

We claim:

1. Apparatus for use with a system to either automatically place said system in a closed feedback wrap test loop or in a signal throughput mode wherein said system performs its normal intended function in a wrap test loop comprising a DAC having a DAC input and a DAC output signal;

an ADC having an ADC input and an ADC output signal;

plug means;

switch connector means alternatively having a first or second state when said plug means is interconnected or disconnected, respectively, said switch connector means being interconnected to said DAC and receiving said DAC signal and further being interconnected to said ADC and receiving said ADC signal;

said switch connector means having
   a first mode configuring said DAC and ADC for said wrap test loop when in said first state and a second mode configuring said DAC in said ADC to sever said wrap test when in said second state, said switch connector means being comprised of a first and second switch connector wired in series when in said first mode;

said series connection of said switch connector means being broken upon disposing of said plug means in either of said first or said second switch connectors wherein when said switch connector means is alternately in said first or second mode, said DAC output is interconnected through said switch connector means to said input of said ADC or disconnected from said ADC input respectively;

test means for introducing a test signal into said DAC input and measuring said output of said ADC when said switch connector means is in said first mode; and computer means interconnected to said switch connector means for detecting when said apparatus is in said first mode; and wherein said test means includes means to automatically activate said introducing and measuring in response to said computer means detecting said first mode of said switch connector means.

2. A method for use with an external signal source including a DAC output and an external signal receptor including an ADC input in wrap back testing comprising establishing a wrap back test loop interconnecting said DAC output to said ADC input to define a first mode;

establishing at least one interconnecting comprised of interconnecting said DAC output to said external signal receptor or interconnecting said ADC input to said external signal source to define a second mode wherein upon severing said interconnection of said DAC output to said ADC input said second mode is automatically established;

detecting when said wrap test loop is established; and automatically introducing a test signal to an input of said DAC in response to said detecting said loop.

3. For use with a system including an external signal source having a DAC output and an external signal receptor with an ADC input, said system further including a switching connector, a first and second plug, a method for providing a wrap test loop, comprising routing said DAC output to said ADC input to establish a portion of said wrap test loop;

severing said portion of wrap test loop;

automatically interconnecting said external signal receptor to said DAC output and/or said external signal source to said ADC input in response to said severing of said loop wherein when said wrap test loop is established said switching connector means comprises a portion of said loop; wherein said external signal receptor is interconnected to said first plug and said external signal source is interconnected to said second plug; said method further comprising the steps of disconnecting said first and second plugs from said switch connector means to establish said wrap test loop and connecting at least one of said first and second plugs to said switch connector means to sever said wrap test loop, automatically introducing a test signal into an input of said DAC and measuring an output of said ADC generated in response to said DAC input when said wrap test loop is established;

generating computerized control signals; and repeating said step of generating a test signal and measuring an ADC output for a plurality of different test signals in response to said computerized control signals to develop a transfer function functionally related to said wrap test loop.

* * * * *